United States Patent
Lee et al.

(10) Patent No.: US 8,525,601 B2
(45) Date of Patent: Sep. 3, 2013

(54) OSCILLATORS USING MAGNETIC DOMAIN WALL AND METHODS OF OPERATING THE SAME

(75) Inventors: Sung-chul Lee, Osan-si (KR); Mathias Klaui, Constance (DE); Sun-ae Seo, Hwaseong-si (KR); Young-jin Cho, Suwon-si (KR); Ung-hwan Pi, Seoul (KR); Ji-young Bae, Seongnam-si (KR); Jin-seong Heo, Daejeon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 208 days.

(21) Appl. No.: 12/654,703

(22) Filed: Dec. 29, 2009

(65) Prior Publication Data

US 2011/0018647 A1 Jan. 27, 2011

(30) Foreign Application Priority Data

Jul. 23, 2009 (KR) ........................ 10-2009-0067461

(51) Int. Cl.
*H03B 17/00* (2006.01)
(52) U.S. Cl.
USPC ................ 331/94.1; 360/324.12; 360/324.11; 257/421; 428/811.2
(58) Field of Classification Search
USPC ...... 257/421; 360/324; 331/157; 428/811.2
See application file for complete search history.

(56) References Cited

U.S. PATENT DOCUMENTS

| | | | |
|---|---|---|---|
| 5,695,864 A | 12/1997 | Slonczewski | |
| 6,532,164 B2 | 3/2003 | Redon | |
| 7,724,469 B2 * | 5/2010 | Gao et al. | 360/125.3 |
| 7,732,881 B2 * | 6/2010 | Wang | 257/421 |
| 2007/0259209 A1 | 11/2007 | Slavin | |
| 2007/0285184 A1 | 12/2007 | Eyckmans | |
| 2008/0019040 A1 | 1/2008 | Zhu | |

FOREIGN PATENT DOCUMENTS

WO WO 2008/101545 8/2008

OTHER PUBLICATIONS

Shehzaad Kaka, et al., "Mutual phase-locking of microwave spin torque nano-oscillators", Nature/vol. 437/15, Sep. 2005, pp. 389-392.
S.I. Kiselev, et al. "Microwave oscillations of a nanomagnet driven by a spin-polarized current" Nature/vol. 425/25 Sep. 2003, pp. 380-383 www.nature.com/nature.
D. Houssameddine, et al., "Spin transfer induced coherent microwave emission with large power from nanoscale MgO tunnel junctions", Applied Physics Letters 93, 022505 (2008).

* cited by examiner

*Primary Examiner* — Arnold Kinkead
(74) *Attorney, Agent, or Firm* — Harness, Dickey & Pierce, P.L.C.

(57) ABSTRACT

An oscillator generates a signal using precession of a magnetic moment of a magnetic domain wall. The oscillator includes a free layer having the magnetic domain wall and a fixed layer corresponding to the magnetic domain wall. A non-magnetic separation layer is interposed between the free layer and the fixed layer.

23 Claims, 9 Drawing Sheets

OSCILLATORS USING MAGNETIC DOMAIN WALL AND METHODS OF OPERATING THE SAME

CROSS-REFERENCE TO RELATED APPLICATION(S)

This application claims priority under 35 U.S.C. §119 to Korean Patent Application No. 10-2009-0067461, filed on Jul. 23, 2009, in the Korean Intellectual Property Office, the disclosure of which is incorporated herein in its entirety by reference.

BACKGROUND

1. Field

One or more example embodiments relate to oscillators and methods of operating oscillators.

2. Description of the Related Art

Oscillators are devices that generate signals having a regular cycle. Oscillators are used in wireless communication systems such as mobile communication terminals, satellite/radar communication devices, wireless network devices, automobile communication devices, analog sound synthesizers, etc. In one example, mobile communication devices operate in specific frequency bands, and a voltage controlled oscillator (VCO) is used to generate a specific frequency band.

Characteristics of a conventional oscillator include a quality factor, output power, and phase noise. As quality factor and output power increase, and phase noise decreases, the performance of the oscillator improves. Recently, because more highly efficient and smaller communication devices are required and operating frequency bands have increased, smaller size and larger output oscillators having higher quality factor and lower phase noise are required.

A spin torque oscillator using a spin transfer torque has recently been introduced. The spin torque oscillator may have a nanopillar structure or a point contact structure. A spin torque oscillator is relatively thin and has a relatively high quality factor compared to conventional LC oscillators and film bulk acoustic resonator oscillators.

However, in a conventional spin torque oscillator, an angle of precession of a magnetic moment (spin) is relatively small, and thus, the output power is relatively low. Also, in a conventional spin torque oscillator having a point contact structure, a critical current needed for precession is relatively high, which increases power consumption.

SUMMARY

One or more example embodiments provide oscillators that are smaller in size, but have increased output power and/or quality factor.

One or more example embodiments provide methods of operating oscillators.

According to one or more example embodiments, an oscillator includes: a free layer having a magnetic domain wall; a separation layer formed on the free layer; and a fixed layer formed on the separation layer. The fixed layer corresponds to the magnetic domain wall. The oscillator generates a signal by precession of a magnetic moment of the magnetic domain wall.

According to at least some example embodiments, the free layer may have a perpendicular magnetic anisotropy, whereas the fixed layer may have an in-plane magnetic anisotropy. The free layer may include: a first region and a second region. The second region may extend to both sides of the first region and have a larger width than that of the first region. The magnetic domain wall may be disposed in the first region.

According to at least some example embodiments, the first region of the free layer or another portion of the free layer may include at least one notch for pinning of the magnetic domain wall. The free layer may further include a plurality of magnetic domain walls. The separation layer may be one of an insulating layer and a conductive layer. The free layer may extend in a first direction, and the plurality of magnetic domain walls may be spaced apart from each other in the first direction.

According to at least some example embodiments, the oscillator may further include: a plurality of laminated structures formed on the free layer. Each of the plurality of laminated structures may be formed of the separation layer and the fixed layer. Each laminated structure may correspond to one of a plurality of magnetic domain walls.

The separation layer and the fixed layer may have the form of a track and may cover the plurality of magnetic domain walls. The free layer may also have the form of a track. In this example, a plurality of first regions having a first (e.g., relatively large) width and a plurality of second regions having a second (e.g., relatively small) width may be alternately repeated. A magnetic domain wall may be included in each of the plurality of second regions.

According to at least some example embodiments, the free layer may include first and second track regions extending at regular intervals and in parallel with one another. A plurality of connection regions may be interposed between the first and second track regions to connect the first and second track regions. Each connection region may include a magnetic domain wall.

One or more example embodiments provides a method of operating an oscillator. According to at least this example embodiment, the oscillator includes: a free layer having a magnetic domain wall; a separation layer formed on the free layer; and a fixed layer formed on the separation layer to correspond to the magnetic domain wall. In a method according to at least this example embodiment, precession of a magnetic moment is induced in the magnetic domain wall, and a change in a resistance between the free layer and the fixed layer due to the precession is detected. The free layer may include a plurality of magnetic domain walls.

According to at least some example embodiments, the free layer may have a perpendicular magnetic anisotropy, whereas the fixed layer may have an in-plane magnetic anisotropy. The precession of the magnetic moment may be induced by applying a current to the oscillator. The current may be applied between the ends of the free layer such that the current passes through the magnetic domain wall. Alternatively, the current may be applied between the free layer and the fixed layer.

According to at least some example embodiments, the precession of the magnetic moment may be induced by applying a magnetic field to the oscillator. The magnetic field may be applied to the free layer in a direction perpendicular to the free layer. In yet another example embodiment, the precession of the magnetic moment may be induced by applying a current and a magnetic field to the free layer.

BRIEF DESCRIPTION OF THE DRAWINGS

Example embodiments will become apparent and more readily appreciated from the following description taken in conjunction with the accompanying drawings of which.

DETAILED DESCRIPTION

Figure 1:
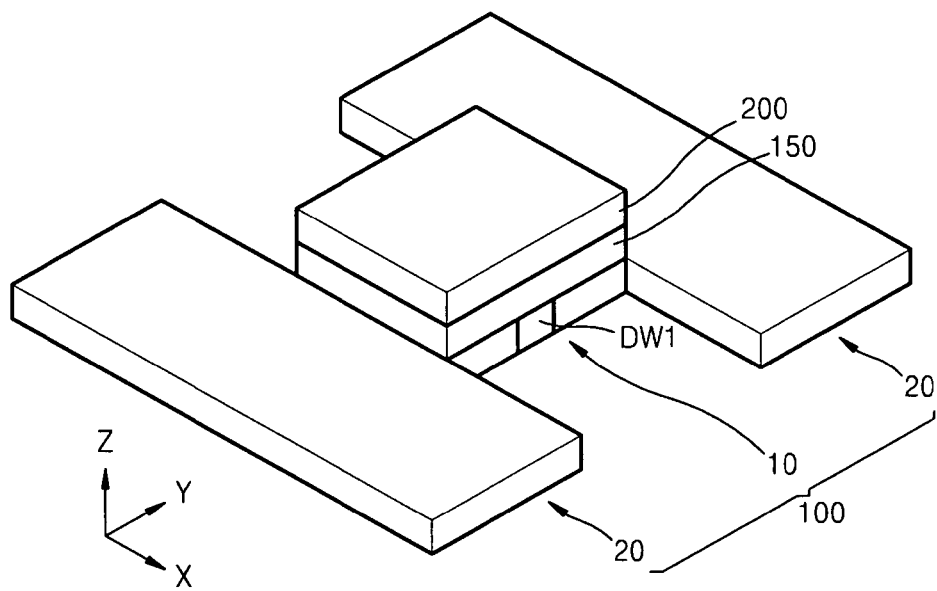
FIG. 1 is a perspective view of an oscillator according to an example embodiment.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. The example embodiments may, however, be embodied in many alternate forms and should not be construed as limited to only those example embodiments set forth herein.

Example embodiments are capable of various modifications and alternative forms. And, it should be understood, however, that there is no intent to limit example embodiments to the particular forms disclosed, but on the contrary, example embodiments are to cover all modifications, equivalents, and alternatives falling within the applicable scope. Like numbers refer to like elements throughout the description of the figures.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Hereinafter, oscillators and methods of operating oscillators according to example embodiments will be described with reference to accompanying drawings. In the drawings, the thicknesses of layers and regions are exaggerated for clarity. Like reference numerals throughout the description denote like elements.

FIG. 1 is a perspective view of an oscillator according to an example embodiment.

Referring to FIG. 1, according to at least this example embodiment, a free layer 100 is disposed on a substrate (not illustrated). The free layer 100 includes a first region 10 at the center thereof and second regions 20 at each side of the first region 10. The widths of the second regions 20 may be larger than the width of the first region 10. For example, as shown in FIG. 1, the first region 10 has a relatively small width and is interposed between two second regions 20, which are spaced apart from each other. As shown in FIG. 1, the first region 10 connects center portions of the two second regions 20. Although not shown, the first region 10 may also connect the end portions of the two second regions 20.

As illustrated in FIG. 1, when the first region 10 connects the center portions of the second regions 20, the free layer 100 has square grooves that face each other at both sides of the first region 10.

Still referring to FIG. 1, a magnetic domain wall DW1 is disposed in the first region 10. In this example, the magnetic domain wall DW1 has a relatively small width. The magnetic domain wall DW1 may be a boundary portion of two adjacent magnetic domains that are magnetized in opposite directions. In this case, the magnetic domains (e.g., D1 and D2 in FIG. 2) that are magnetized in opposite directions are included at respective sides of the magnetic domain wall DW1 of the free layer 100. The free layer 100 may have, for example, perpendicular magnetic anisotropy. When the free layer 100 has a perpendicular magnetic anisotropy, the magnetic domains (e.g., D1 and D2 in FIG. 2) that form the free layer 100 may also have a perpendicular magnetization direction; that is, a magnetization direction parallel to a Z-axis. Alternatively, the magnetic domain wall DW1 may have a horizontal magnetization direction; that is, a magnetization direction perpendicular to the Z-axis. The free layer 100 illustrated in FIG. 1 is only an example, and the form of the free layer 100 may be changed in various ways.

Still referring to the example embodiment shown in FIG. 1, a separation layer 150 is formed on the first region 10. The separation layer 150 may be a non-magnetic layer. In one example, the separation layer 150 is an insulating layer formed of an oxide such as magnesium oxide (MgO) or the like. The separation layer 150 may be formed of an insulating material other than an oxide. The separation material 150 may also be a conductive material. When the separation layer 150 is an insulating layer, the separation layer 150 may have a thickness so that tunneling of electrons is possible.

A fixed layer 200 is formed on the separation layer 150. According to at least one example embodiment, the fixed layer 200 is a ferromagnetic layer having a fixed magnetization direction. The fixed layer 200 may have, for example, an in-plane magnetic anisotropy; that is, a magnetization direction perpendicular to the Z-axis. In this case, the magnetization direction of the fixed layer 200 may be parallel to the magnetization direction of the magnetic domain wall DW1.

FIG. 1 illustrates the separation layer 150 and the fixed layer 200 disposed on the first region 10. However, the area for forming the separation layer 150 and the fixed layer 200 may be greater than that shown in FIG. 1. Although not illustrated in FIG. 1, electrodes that contact respective sides of the free layer 100 and the fixed layer 200 may also be included in the oscillator.

FIGS. 2A and 2B are plan views of the free layer 100 and the fixed layer 200 included in the oscillator of FIG. 1.

Referring to FIG. 2A, the magnetic domain wall DW1 is disposed in the first region 10 of the free layer 100. More specifically, in FIG. 2A the magnetic domain wall DW1 is disposed at the center portion of the first region 10. Also, the magnetic domain wall DW1 may have a magnetization direction parallel to an X-axis, which is illustrated by an arrow. If the magnetic domain wall DW1 is formed at the center portion of the first region 10 of the free layer 100, each of magnetic domains (hereinafter, referred to as a first magnetic domain and a second magnetic domain) D1 and D2, which are magnetized in different directions, is present at a respective side of the magnetic domain wall DW1 in the free layer 100. The magnetic direction of the first and second magnetic domains D1 and D2 may be parallel to a Z-axis. For example, the first magnetic domain D1 may be magnetized in the Z-axis direction and the second magnetic domain D2 may be magnetized in a direction opposite to the direction of the Z-axis.

Regarding FIGS. 2A and 2B, ⊙ and ⊗ indicate respective magnetization directions of the first magnetic domain D1 and the second magnetic domain D2.

In FIG. 2B, the magnetization direction of the fixed layer 200 is parallel to the X-axis and is indicated by the arrow illustrated in the fixed layer 200. The magnetization directions of the first and second magnetic domains D1 and D2, the magnetic domain wall DW1, and the fixed layer 200 are only examples.

Oscillators according to example embodiments may generate a signal in a specific frequency band using precession of a magnetic moment of the magnetic domain wall DW1. The precession of the magnetic moment refers to rotation of an axis of the magnetic moment in a specific orbit. The axis direction of the magnetic moment may be the same as the magnetization direction. Thus, the precession of the magnetic moment may correspond to a rotation of the magnetization direction. Due to the precession of the magnetic moment of the magnetic domain wall DW1, an electric resistance between the free layer 100 and the fixed layer 200 may be changed periodically. As a result, a signal in a specific frequency band may oscillate, as will be described more fully with reference to FIG. 3.

Figure 2:
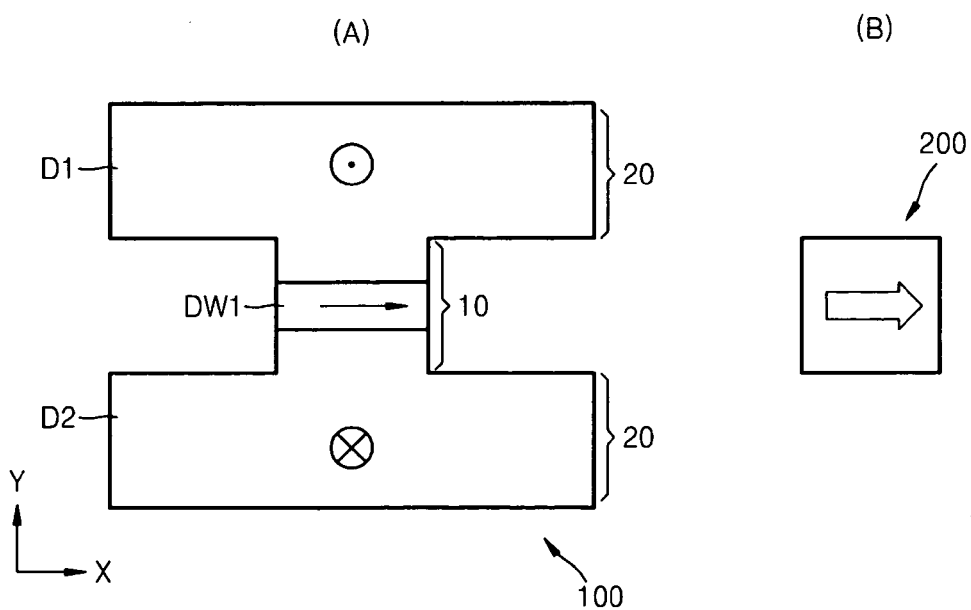
FIGS. 2A and 2B are plan views of a free layer and a fixed layer, respectively, included in the oscillator of FIG. 1.
Figure 3:
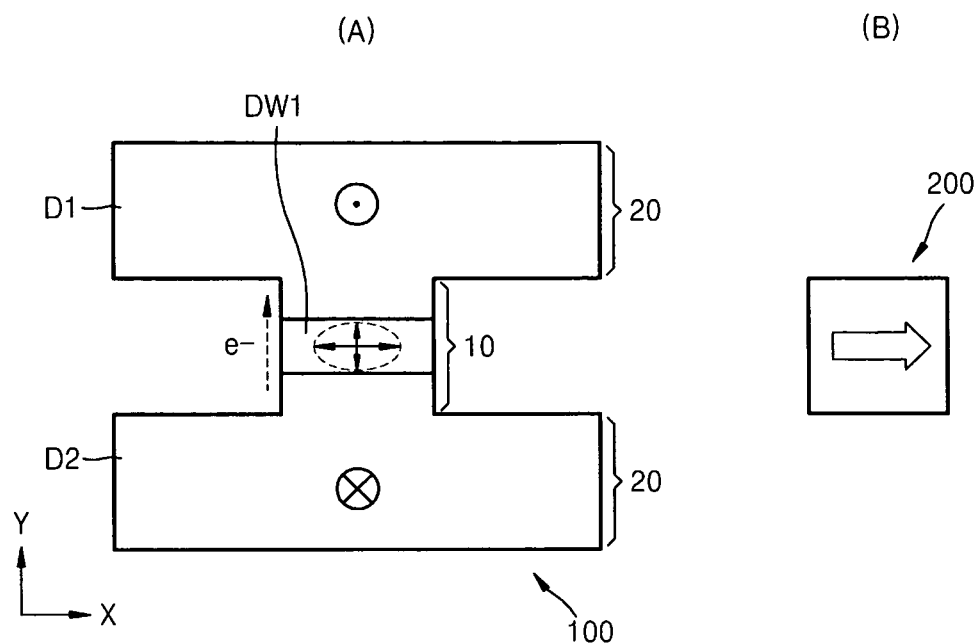
FIGS. 3A and 3B are plan views showing example precession of a magnetic moment in a magnetic domain wall of FIG. 2.

FIG. 3 is a plan view showing an example precession of the magnetic moment in the magnetic domain wall DW1 of FIG. 2.

Referring to FIG. 3, precession of the magnetic moment in the magnetic domain wall DW1 may be induced by applying a current to the free layer 100. In response to the applied current, in this example, the magnetization direction of the magnetic domain wall DW1 rotates. In FIG. 3, a current is applied between both sides of the free layer 100 such that an electron e-flows from one end of the free layer 100 to the other end of the free layer 100 passing through the magnetic domain wall DW1, and the magnetization direction of the magnetic domain wall DW1 rotates. However, example embodiments are not limited to this description. Instead of applying a current between sides of the free layer 100, a current may be applied between the free layer 100 and the fixed layer 200 to induce precession of the magnetic moment in the magnetic domain wall DW1.

The magnetic moment in the magnetic domain wall DW1 may rotate by a rotation angle of equal to or about 360°. In this example embodiment, the magnetic domain wall DW1 does not include a magnetization component in the Z-axis direction so that the magnetic moment in the magnetic domain wall DW1 rotates while remaining parallel to the XY plane. Thus, an angle of the precession is relatively large (e.g., very large). If the magnetic moment in the magnetic domain wall DW1 rotates while remaining parallel to the XY plane, a parallel state and an anti-parallel state are periodically repeated.

In the parallel state, the magnetization direction of the free layer 100 and the magnetization direction of the fixed layer 200 are the same, but in the anti-parallel state the magnetization direction of the free layer 100 and the magnetization direction of the fixed layer 200 are opposite. Moreover, an electric resistance between the free layer 100 and the fixed layer 200 in the parallel state is relatively low, whereas an electric resistance between the free layer 100 and the fixed layer 200 in the anti-parallel state is relatively high.

Because the magnetic moment of the magnetic domain wall DW1 rotates by equal to or about 360° in the XY plane, the electric resistance between the free layer 100 and the fixed layer 200 may be repeatedly relatively low and relatively high. Thus, the oscillator according to at least this example embodiment may have relatively high output power compared with that of a general oscillator.

The precession according to at least this example embodiment may be induced by applying a current. If an external magnetic field is used to increase an angle of the precession, the structure and operating method of the oscillator may be relatively complicated. However, the precession at a maximum angle may be more easily induced by applying a current according to at least this example embodiment. Nevertheless, a magnetic field may be utilized to induce the precession in accordance with at least some example embodiments. Also, a magnetic field may be used along with a current.

In accordance with one or more example embodiments, the precession of the magnetic moment in the magnetic domain wall DW1 allows reduction (e.g., significant reduction) in a critical current for oscillation as compared with the precession of the magnetic moment in the magnetic domains. This is because the magnetic moment in the magnetic domain wall DW1 rotates in the in-plane (e.g., the XY plane), whereas the magnetic moment in the magnetic domains does not rotate in the in-plane, but instead rotates in a direction perpendicular to the in-plane.

In addition, oscillators according to one or more example embodiments may be frequency tunable oscillators with a tunable oscillation frequency. For example, in an oscillator according to at least this example embodiment, the oscillation frequency may be tuned according to the intensity of an applied current and/or a magnetic field, and/or according to the form, size, and property (e.g., damping constant) of the free layer 100.

Figure 4:
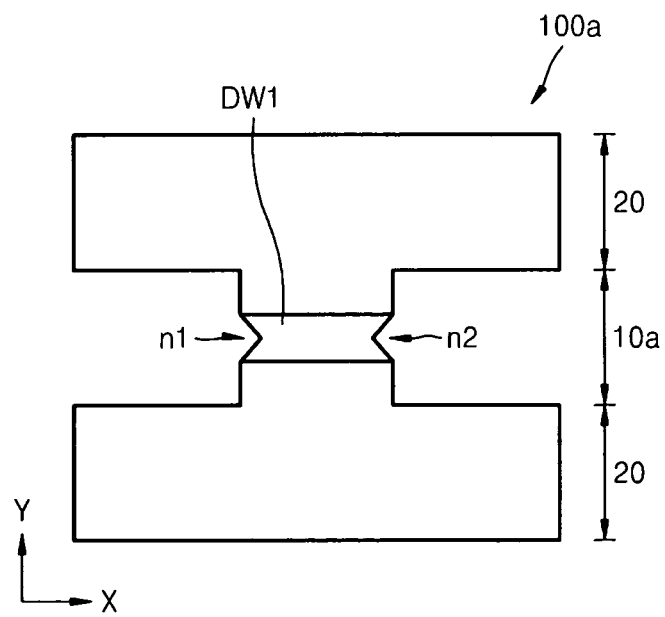
FIGS. 4 through 6 are plan views of example free layers of an oscillator according to one or more example embodiments.
Figure 5:
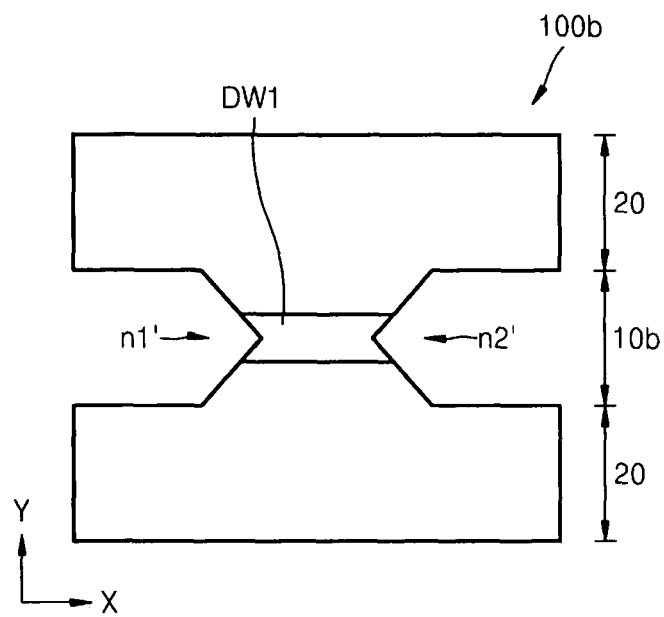
Figure 6:
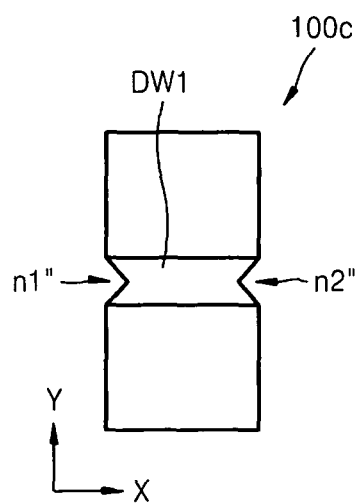

The shape of the free layer 100 illustrated in FIG. 1 may be varied. FIGS. 4 through 6 are plan views of free layers 100a, 100b, and 100c having various shapes used in oscillators according to other example embodiments.

Referring to FIG. 4, notches n1 and n2 are formed at respective sides of a first region 10a. In this example, the notches n1 and n2 function as pinning sites for fixing the magnetic domain wall DW1. This is because when the magnetic domain wall DW1 is formed in the region having a relatively small width (e.g., a region where the notches n1 and n2 are formed), the magnetic domain wall DW1 may be more stable in terms of energy.

In FIG. 4, the notches n1 and n2 are relatively small. However, the size thereof may increase as illustrated in FIG. 5.

Referring to FIG. 5, the length of notches n1' and n2' in a Y-axis is equal or substantially equal to a length of a first region 10b in a Y-axis direction.

As illustrated in FIGS. 4 and 5, when the notches n1, n1', n2, and n2' are included in the first regions 10a and 10b, the magnetic domain wall DW1 may be pinned due to the notches n1, n1', n2, and n2' so that a region having a relatively large width (e.g., a second region 20) may not be needed. In this example, the free layer 100c illustrated in FIG. 6 may be used.

Referring to the example embodiment shown in FIG. 6, the free layer 100c is substantially rectangular and includes notches n1" and n2" that face each other at respective sides thereof.

In FIGS. 4 through 6, the notches n1, n1', n1", n2, n2', and n2" are included at sides of the center portion of the free layers 100a, 100b, and 100c. Alternatively, however, the notches n1, n1', n1", n2, n2', and n2" may be included at one side, rather than both sides. Also, in addition to using notches, other methods to pin the magnetic domain wall DW1 may be used. For example, when the property of the free layer is changed by injection of impurities to some region or portion of the free layer, the magnetic domain wall may be pinned at the region to which the impurity is injected. Accordingly, the notches n1" and n2" may be omitted from the free layer 100c.

Referring back to FIG. 1, when a notch is not formed in the first region 10, the magnetic domain wall DW1 may be moved slightly by applying a current or a magnetic field. However, the magnetic domain wall DW1 remains in the first region 10 because it is relatively difficult for the magnetic domain wall DW1 to move out of the first region 10 having a relatively small width and into the second region 20 having a relatively large width. Accordingly, the magnetic domain wall DW1 may only move in the first region 10 that is overlapped with the fixed layer 200.

An oscillator according to another example embodiment includes a plurality of magnetic domain walls as will be described with reference to FIGS. 7 through 10.

Figure 7:
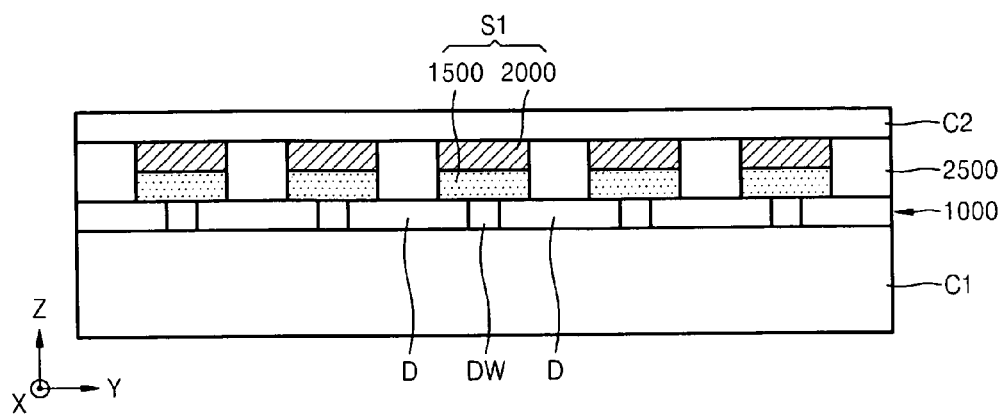
FIGS. 7 and 8 are cross-sectional views of an oscillator according to another example embodiment.

FIG. 7 is a cross-sectional view of an oscillator according to another example embodiment.

Referring to FIG. 7, a first conductive layer C1 is formed on a substrate (not illustrated) and a free layer 1000 is formed on the first conductive layer C1. The free layer 1000 may be formed as a track extending in a Y-axis direction. In this example embodiment, the free layer 1000 includes a plurality of magnetic domains D arranged in a line according to the direction in which the free layer 1000 extends. A magnetic domain wall DW is interposed between each pair of adjacent magnetic domains D. Thus, the plurality of magnetic domain walls DW are spaced apart from each other and arranged in a line in the extending direction of the free layer 1000. The plane structure of the free layer 1000 will be described in more detail later.

A plurality of laminated structures S1 are formed on the free layer 1000. Each laminated structure S1 includes a separation layer 1500 and a fixed layer 2000 that are laminated. In this example, each laminated structure S1 corresponds to a magnetic domain wall DW. The separation layer 1500 and the fixed layer 2000 may be the same or substantially the same as the separation layer 150 and the fixed layer 200 described above with regard to FIG. 1. Interlayer insulating layers 2500 that fill the spaces between the plurality of laminated structures S1 are also provided.

Still referring to the example embodiment shown in FIG. 7, a second conductive layer C2 is formed on the interlayer insulating layer 2500. The second conductive layer C2 is commonly contacted by the interlayer insulating layers 2500 and the fixed layers 2000. According to at least one example embodiment, the first and second conductive layers C1 and C2 may serve as electrodes. Alternatively, the free layer 1000 and/or some portion of the fixed layers 2000 may be used as electrodes so that at least one of the first conductive layer C1 and the second conductive layer C2 may be omitted. In this case, inclusion of the first conductive layer C1 and the second conductive layer C2 may be optional.

In FIG. 7, the plurality of fixed layers 2000 correspond to the plurality of magnetic domain walls DW in a one to one correspondence. However, the fixed layers 2000 may extend in the form of a track in another example embodiment. In this case, the separation layer and the fixed layer may have a similar or substantially similar form. An example in which a separation layer and a fixed layer are formed as tracks is illustrated in FIG. 8.

Figure 8:
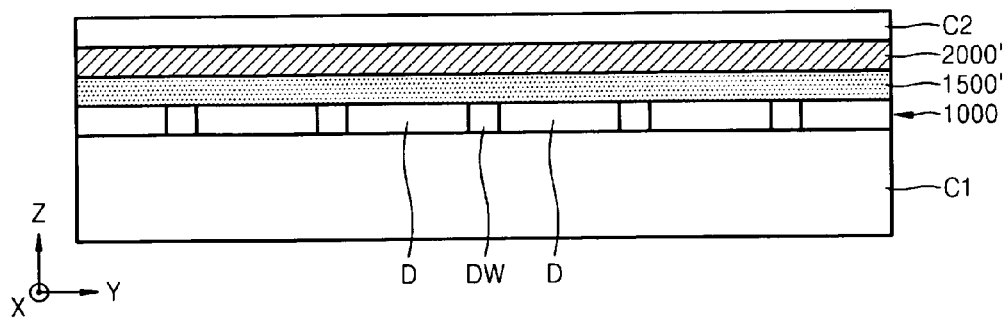

Referring to FIG. 8, in this example embodiment a separation layer 1500' and a fixed layer 2000' are sequentially formed on the free layer 100. The separation layer 1500' and the fixed layer 2000' have the form of a track extending in the same direction as the direction in which the free layer 1000 extends. In this case, the separation layer 1500' and the fixed layer 2000' may have a width and length sufficient to cover at least the plurality of magnetic domain walls DW when viewed from the top.

In accordance with the example embodiments shown in FIGS. 7 and 8, the free layer 1000 may have various plane structures. In one example, the free layer 1000 may have the plane structure shown in FIG. 9.

Figure 9:
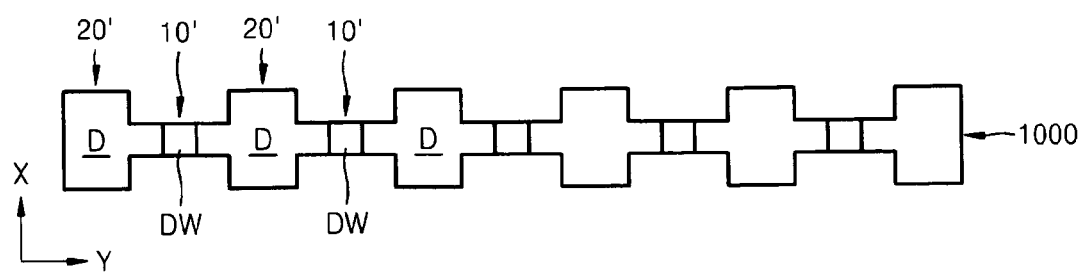
FIG. 9 is a plan view of a free layer of the oscillator shown in FIGS. 7 and 8.

Referring to FIG. 9, the free layer 1000 has a form in which a plurality of first regions 10' and a plurality of second regions 20' are alternately repeated. In this example, each of the plurality of first regions has a relatively small width, and ends or portions of the free layer 1000 at each side of the first regions 10' serve as the second regions 20'. Accordingly, each of a plurality of magnetic domain walls DW is disposed in a corresponding one of the plurality of first regions 10', and a magnetic domain D is disposed at each side of each magnetic domain wall DW. When one first region 10' and the second regions 20' at both sides of the first region 10' constitute one unit structure in FIG. 9, the unit structure may be similar or substantially similar to the free layer 100 of FIG. 1. However, the unit structure may be changed to the structures shown, for example, in FIGS. 4 through 6.

Figure 10:
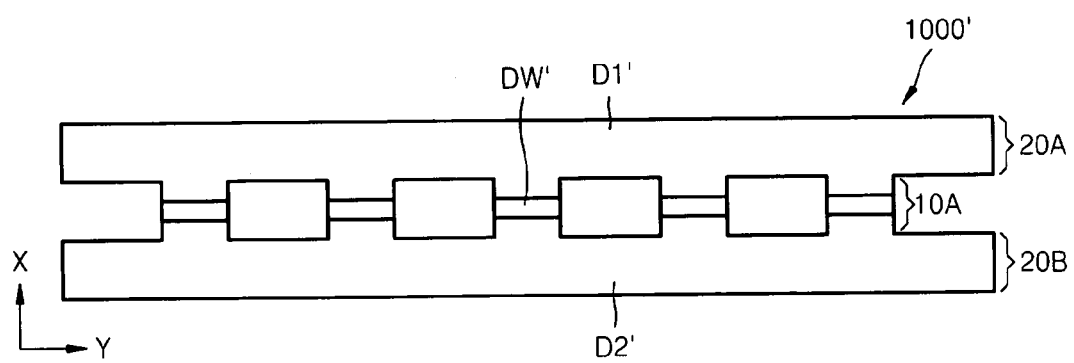
FIG. 10 is a plan view of a free layer of an oscillator according to another example embodiment.

According to at least one other example embodiment, a free layer 1000' may have a plane structure as shown in FIG. 10.

Referring to FIG. 10, in this example embodiment the free layer 1000' includes first and second track regions 20A and 20B that extend in parallel to each other at regular intervals. A plurality of connection regions 10A are interposed between the first and second track regions 20A and 20B. A magnetic domain wall DW' is included in each of the plurality of connection regions 10A. A first magnetic domain D1' is included at one side of the plurality of magnetic domain walls DW' (e.g., the side of the first track region 20A) and a second magnetic domain D2' is included at the other (e.g., opposite) side of the plurality of magnetic domain walls DW' (e.g., the side of the second track region 20B). The first and second magnetic domains D1' and D2' may have different magnetization directions. Although not illustrated, the separation layer and the fixed layer may be similar or substantially similar to those described above with regard to FIG. 7 and/or FIG. 8.

As described with reference to FIGS. 7 through 10, when oscillators according to example embodiments include a plurality of magnetic domain walls, a resonance frequency (e.g., synchronization of spin waves) generated from the plurality of magnetic domain walls may be used and output power of the oscillators may be increased (e.g., greatly increased). In one example, the output power of the oscillators may increase in proportion to the square of the number of the magnetic domain walls.

Figure 11:
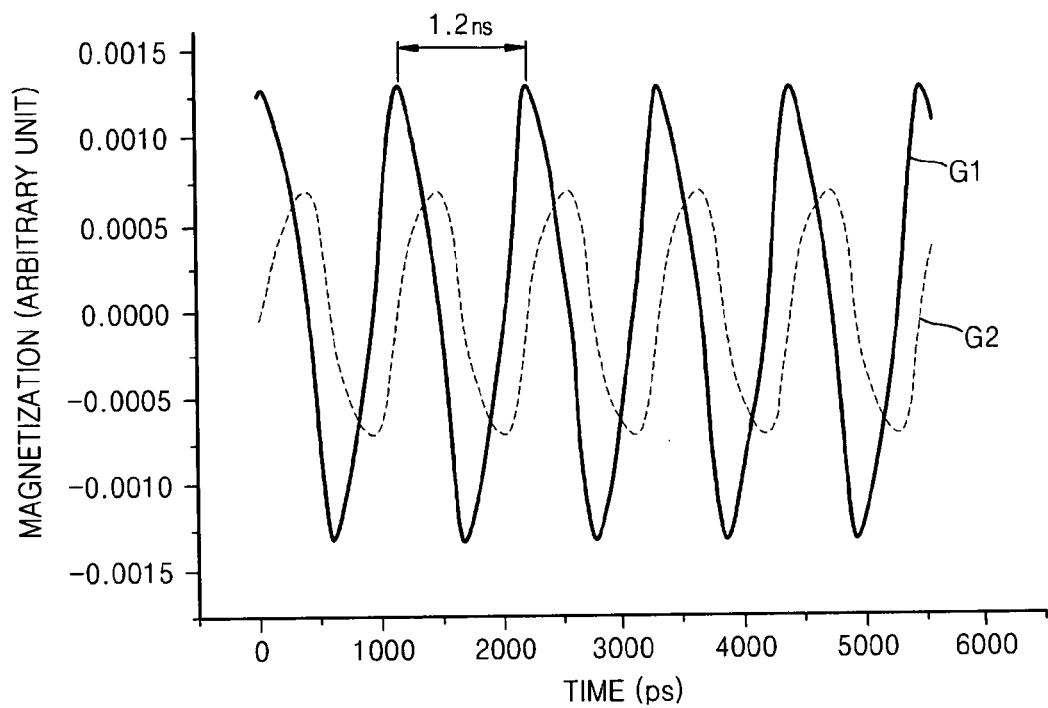
FIG. 11 is a graph showing an example change in magnetization of a magnetic domain wall in the oscillator of FIG. 1 according to time, during precession of a magnetic moment of the magnetic domain wall.

FIG. 11 is a graph showing an example change in magnetization of the magnetic domain wall DW1 in the oscillator of FIG. 1 according to time when precession of the magnetic domain wall DW1 is induced in the oscillator of FIG. 1. In this example, the free layer 100 is a perpendicular magnetic anisotropic cobalt/platinum (Co/Pt) layer, the separation layer 150 is a magnesium oxide (MgO) layer, and the fixed layer 200 is an in-plane magnetic anisotropic Cobalt-Iron-Boron (CoFeB) layer. In FIG. 11, a first graph G1 represents a change in magnetization of X-axis components and a second graph G2 represents a change in magnetization of Y-axis components.

Referring to FIG. 11, a vibration occurs at a regular cycle according to the first and second graphs G1 and G2. A vibration cycle of the first and second graphs G1 and G2 is about the same; that is about 1200 picoseconds (ps) or 1.2 nanoseconds (ns), which indicates that the magnetic moment of the magnetic domain wall DW1 rotates in a cycle of about 1.2 ns. The cycle converts into a frequency of about 900 MHz.

Figure 12:
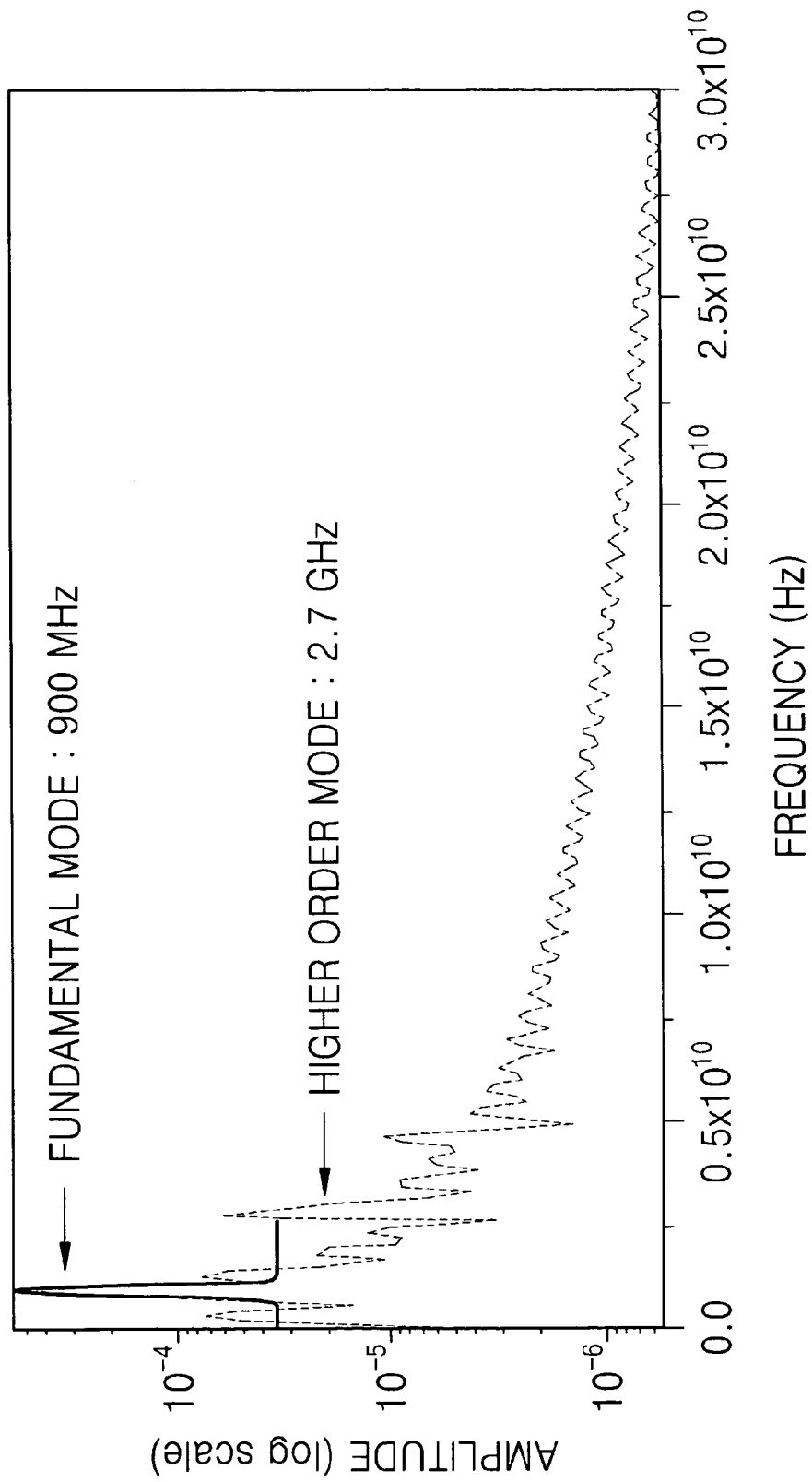
FIG. 12 is a graph obtained by Fourier transformation of the graph of FIG. 11.

FIG. 12 is a graph obtained by a Fourier transformation of the graph of FIG. 11.

Referring to FIG. 12, the fundamental mode frequency is about 900 MHz, which is the same as the result obtained by calculation in FIG. 11.

Figure 13:
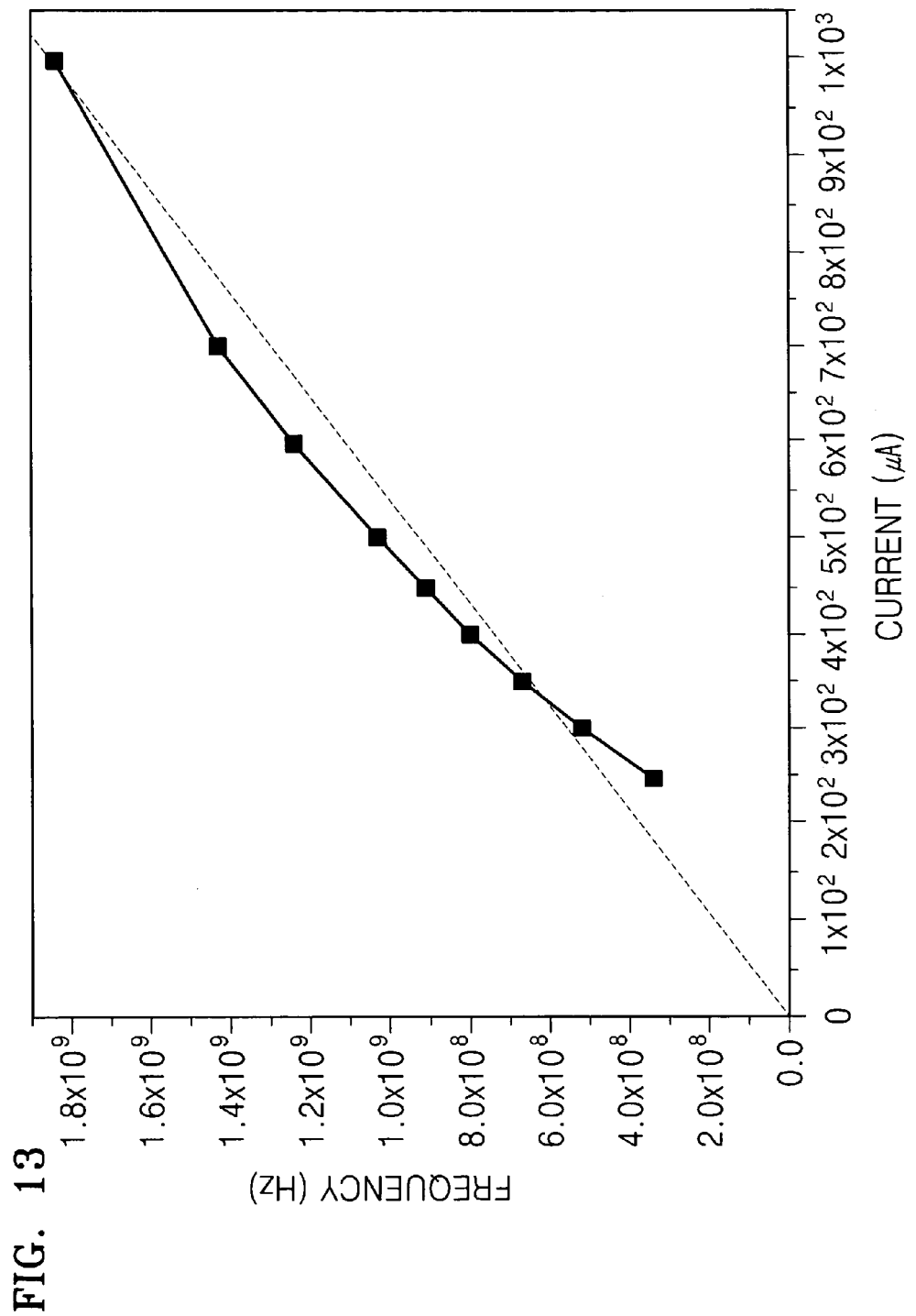
FIG. 13 is a graph illustrating an example change in oscillation frequency according to the intensity of a current applied to a free layer in the oscillator of FIG. 1.

FIG. 13 is a graph illustrating an example change in an oscillation frequency according to the intensity of a current applied to the free layer 100 in the oscillator of FIG. 1. In this example, the free layer 100 is a Co/Pt layer, the separation layer 150 is an MgO layer, and the fixed layer 200 is a CoFeB layer. The depth of the grooves (e.g., the length in an X-axis direction) formed in both side surfaces of the free layer 100 is about 10 nm.

Referring to FIG. 13, as the intensity of the current for the precession increases, the oscillation frequency increases. As the current increases, the oscillation frequency increases nearly linearly. As a result, an oscillator according to at least this example embodiment may be used as a frequency tunable oscillator.

Hereinafter, a method of operating an oscillator according to an example embodiment will be described.

Figure 14:
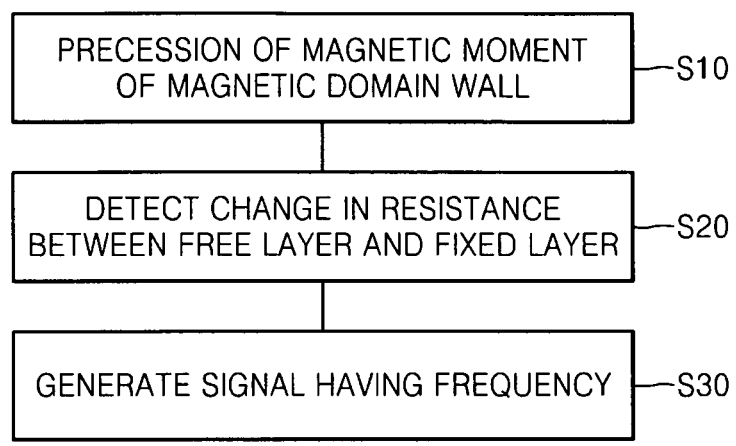
FIG. 14 is a flowchart illustrating a method of operating an oscillator according to an example embodiment.

FIG. 14 is a flowchart illustrating a method of operating an oscillator according to an example embodiment and is described in connection with FIGS. 1 and 7.

Referring to FIG. 14, precession of the magnetic moment in the magnetic domain wall is induced at S10. Referring to the example embodiment shown in FIG. 1, the precession of the magnetic moment in the magnetic domain wall DW1 may be induced by applying a current to the free layer 100 such that the current passes through the magnetic domain wall DW1 from one end of the free layer 100 to the other end of the free layer 100, or by applying a current between the free layer 100 and the fixed layer 200. Alternatively or in addition, the precession may be induced by applying a magnetic field to the free layer 100. In this example, the magnetic field may be applied in a direction perpendicular to the free layer 100 (e.g., the Z-axis direction). Alternatively, the precession may be induced by applying a current and a magnetic field together to the free layer 100.

With regard to FIG. 7, the precession of the magnetic moment in the magnetic domain walls DW may be induced by applying a current between ends of the free layer 1000, or between the free layer 1000 and the fixed layer 2000. The precession may also be induced by applying a magnetic field to the free layer 1000, or by applying both the current and the magnetic field together to the free layer 1000.

Referring back to FIG. 14, at S20 a change in an electric resistance between the free layers 100 and 1000 and the fixed layers 200 and 2000 is detected during precession of the magnetic moment in the magnetic domain walls DW1 and DW. The electric resistance between the free layers 100 and 1000 and the fixed layers 200 and 2000 may be periodically changed due to the precession, which is described with reference to FIG. 3.

At S30 in FIG. 14, a signal having a given frequency is generated due to the change in the electric resistance between the free layers 100 and 1000 and the fixed layers 200 and 2000. As the intensity of the current and/or the magnetic field inducing the precession is controlled or the form, size, and/or property of the free layers 100 and 1000 are controlled, the oscillated frequency may vary.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. An oscillator comprising:
   a free layer having at least two adjacent magnetic domains, and a magnetic domain wall between the at least two adjacent magnetic domains;
   a separation layer formed on the free layer; and
   a fixed layer formed on the separation layer to correspond to the magnetic domain wall; wherein
   a signal is generated by precession of a magnetic moment of the magnetic domain wall.

2. The oscillator of claim 1, wherein the free layer has a perpendicular magnetic anisotropy and the fixed layer has an in-plane magnetic anisotropy.

3. The oscillator of claim 1, wherein the separation layer is one of an insulating layer and a conductive layer.

4. The oscillator of claim 1, wherein the free layer comprises:
   a first region; and
   a second region at each side of the first region; wherein
      the second region has a larger width than that of the first region, and
      the magnetic domain wall is disposed in the first region.

5. The oscillator of claim 4, wherein the first region of the free layer comprises:
   at least one notch for pinning the magnetic domain wall.

6. The oscillator of claim 1, wherein the free layer comprises:
   at least one notch for pinning the magnetic domain wall.

7. The oscillator of claim 1, wherein the free layer comprises:
   a plurality of magnetic domain walls.

8. The oscillator of claim 7, wherein the free layer extends in a first direction, and the plurality of magnetic domain walls are spaced apart from each other in the first direction.

9. The oscillator of claim 8, wherein the separation layer and the fixed layer constitute a laminated structure, and the oscillator further comprises:
a plurality of laminated structures formed on the free layer, each laminated structure corresponding to one of the plurality of magnetic domain walls.

10. The oscillator of claim 8, wherein the separation layer and the fixed layer have the form of a track and are formed to cover the plurality of magnetic domain walls.

11. The oscillator of claim 1, wherein the free layer has the form of a track in which a plurality of first regions having a first width and a plurality of second regions having a second width are alternately repeated, the first width being larger than the second width, and wherein a magnetic domain wall is included in each of the plurality of second regions.

12. The oscillator of claim 1, wherein the free layer comprises:
first and second track regions formed in parallel with one another; and
a plurality of connection regions interposed between the first and second track regions, and connecting the first and second track regions; wherein
each of the plurality of connection regions includes a magnetic domain wall.

13. A method of operating the oscillator of claim 1, the method comprising:
inducing precession of a magnetic moment in the magnetic domain wall; and
detecting a change in resistance between the free layer and the fixed layer due to the precession.

14. The method of claim 13, wherein the free layer has a perpendicular magnetic anisotropy and the fixed layer has an in-plane magnetic anisotropy.

15. The method of claim 13, wherein the precession of the magnetic moment is induced by applying a current to the oscillator.

16. The method of claim 15, wherein the current is applied between ends of the free layer such that the current passes through the magnetic domain wall.

17. The method of claim 15, wherein the current is applied between the free layer and the fixed layer.

18. The method of claim 13, wherein the precession of the magnetic moment is induced by applying a current and a magnetic field to the free layer.

19. The method of claim 18, wherein the magnetic field is applied to the free layer in a direction perpendicular to the free layer.

20. The method of claim 13, wherein the precession of the magnetic moment is induced by applying a magnetic field to the free layer.

21. The method of claim 13, wherein the free layer comprises:
a plurality of magnetic domain walls.

22. An oscillator comprising:
a free layer having a magnetic domain wall between two adjacent magnetic domains, the free layer including a first region and a second region at each side of the first region, the second region having a larger width than a width of the first region, and the magnetic domain wall being disposed in the first region;
a separation layer formed on the free layer; and
a fixed layer formed on the separation layer to correspond to the magnetic domain wall; wherein
a signal is generated by precession of a magnetic moment of the magnetic domain wall.

23. An oscillator comprising:
a free layer having a magnetic domain wall between two adjacent magnetic domains;
a separation layer formed on the free layer; and
a fixed layer formed on the separation layer to correspond to the magnetic domain wall; wherein
a signal is generated by precession of a magnetic moment of the magnetic domain wall, and
the free layer has the form of a track in which a plurality of first regions having a first width and a plurality of second regions having a second width are alternately repeated, the first width being larger than the second width, and wherein a magnetic domain wall is included in each of the plurality of second regions.

* * * * *